US009807502B1

(12) United States Patent
Hatab et al.

(10) Patent No.: US 9,807,502 B1
(45) Date of Patent: Oct. 31, 2017

(54) PSYCHOACOUSTICS FOR IMPROVED AUDIO REPRODUCTION AND SPEAKER PROTECTION

(71) Applicant: Cirrus Logic International Semiconductor Ltd., Edinburgh (GB)

(72) Inventors: Ziad Ramez Hatab, Austin, TX (US); Dalton Elliot Altstaetter, Arlington, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/192,507

(22) Filed: Jun. 24, 2016

(51) Int. Cl.
| | |
|---|---|
| *H04R 3/04* | (2006.01) |
| *G10L 19/02* | (2013.01) |
| *H04R 3/00* | (2006.01) |

(52) U.S. Cl.
CPC ............ *H04R 3/04* (2013.01); *G10L 19/0204* (2013.01); *H04R 3/007* (2013.01); *H04R 2430/01* (2013.01); *H04R 2430/03* (2013.01)

(58) Field of Classification Search
CPC . H04R 3/00; H04R 3/04; H04R 3/007; H04R 2430/01; H04R 2430/03; G10L 19/00; G10L 19/0204; G10L 19/2012; G10L 25/18; G10L 21/00; G10L 21/038
See application file for complete search history.

(56) References Cited

U.S. PATENT DOCUMENTS

| | | | |
|---|---|---|---|
| 8,855,322 | B2 | 10/2014 | Ryu et al. |
| 9,161,126 | B2 | 10/2015 | Su et al. |
| 2002/0118841 | A1* | 8/2002 | Button ..................... H04R 3/00 381/55 |
| 2012/0051558 | A1* | 3/2012 | Kim ....................... H03G 9/025 381/98 |
| 2012/0179456 | A1 | 7/2012 | Ryu et al. |
| 2013/0216049 | A1* | 8/2013 | Wolf ........................ H04R 1/00 381/55 |
| 2013/0329894 | A1 | 12/2013 | Krishnaswamy et al. |
| 2013/0336502 | A1 | 12/2013 | Jung et al. |

(Continued)

OTHER PUBLICATIONS

Chiu, Leung Kin "Efficient Audio Signal Processing for Embedded Systems", Thesis presented to the Academic Faculty at Georgia Institute of Technology, Aug. 2012.

(Continued)

*Primary Examiner* — Thang Tran
(74) *Attorney, Agent, or Firm* — Norton Rose Fulbright US LLP

(57) ABSTRACT

Psychoacoustic models may be applied to audio signals being reproduced by an audio speaker to reduce input signal energy applied to the audio transducer. Using the psychoacoustic model, the input signal energy may be reduced in a manner that has little or no discernible effect on the quality of the audio being reproduced by the transducer. The psychoacoustic model selects energy to be reduced from the audio signal based, in part, on human auditory perceptions and/or speaker reproduction capability. The modification of energy levels in audio signals may be used to provide speaker protection functionality. For example, modified audio signals produced through the allocation of compensation coefficients may reduce excursion and displacement in a speaker; control temperature in a speaker; and/or reduce power in a speaker.

36 Claims, 12 Drawing Sheets

(56) References Cited

U.S. PATENT DOCUMENTS

2014/0254804 A1    9/2014  Su
2017/0011748 A1*  1/2017  Porter .................. G10L 19/032

OTHER PUBLICATIONS

Chen, et al., "A 2.5W Tablet Speaker Delivering 3.2W Pseudo High Power by Psychoacoustic Model Based Adaptive Power Management System", IEEE Asian Solid-State Circuits Conference, Nov. 10-12, 2014, Kaohsiung, Taiwan.

* cited by examiner

| NUMBER | CENTER FREQUENCIES Hz | CUT-OFF FREQUENCIES Hz | BANDWIDTH Hz |
|---|---|---|---|
|  |  | 20 |  |
| 1 | 50 | 100 | 80 |
| 2 | 150 | 200 | 100 |
| 3 | 250 | 300 | 100 |
| 4 | 350 | 400 | 100 |
| 5 | 450 | 510 | 110 |
| 6 | 570 | 630 | 120 |
| 7 | 700 | 770 | 140 |
| 8 | 840 | 920 | 150 |
| 9 | 1000 | 1080 | 160 |
| 10 | 1170 | 1270 | 190 |
| 11 | 1370 | 1480 | 210 |
| 12 | 1600 | 1720 | 240 |
| 13 | 1850 | 2000 | 280 |
| 14 | 2150 | 2320 | 320 |
| 15 | 2500 | 2700 | 380 |
| 16 | 2900 | 3150 | 450 |
| 17 | 3400 | 3700 | 550 |
| 18 | 4000 | 4400 | 700 |
| 19 | 4800 | 5300 | 900 |
| 20 | 5800 | 6400 | 1100 |
| 21 | 7000 | 7700 | 1300 |
| 22 | 8500 | 9500 | 1800 |
| 23 | 10500 | 12000 | 2500 |
| 24 | 13500 | 15500 | 3500 |

FIG. 5

PSYCHOACOUSTICS FOR IMPROVED AUDIO REPRODUCTION AND SPEAKER PROTECTION

FIELD OF THE DISCLOSURE

The instant disclosure relates to audio processing. More specifically, portions of this disclosure relate to improving audio reproduction with speakers.

BACKGROUND

Audio speakers or loudspeakers are ubiquitous on many devices used by individuals, including televisions, stereo systems, computers, smart phones, and many other consumer devices. Generally speaking, an audio speaker is an electroacoustic transducer that produces sound in response to an electrical audio signal input. Given its nature as a mechanical device, an audio speaker may be subject to damage caused by operation of the speaker, including overheating and/or overexcursion, in which physical components of the speaker are displaced too far a distance from a resting position. To prevent such damage from happening, speaker systems often include control systems capable of controlling audio gain, audio bandwidth, and/or other components of an audio signal to be communicated to an audio speaker.

Speaker protection techniques can reduce the input signal energy in such a way so as to protect the speaker from over-excursion and/or over-heating damage, while simultaneously minimizing the unwanted audible effects to the output signal. Conventional techniques use voltage and current sensing feedback information in order to adaptively model the speaker status and, consequently, to estimate speaker displacement and temperature. Various filtering, equalization, and amplitude scaling are then performed on the input signal to minimize its energy. Unfortunately, most of these techniques do not take into account the human audio perception aspects and consequently the resulting processed signal is audibly degraded in an uncontrollable fashion.

Shortcomings mentioned here are only representative and are included simply to highlight that a need exists for improved electrical components, particularly for audio components employed in consumer-level devices, such as mobile phones. Embodiments described herein address certain shortcomings but not necessarily each and every one described here or known in the art.

SUMMARY

Psychoacoustic models may be applied to audio signals being reproduced by the audio transducer to reduce input signal energy applied to the audio transducer. Using the psychoacoustic model, the input signal energy may be reduced in a manner that has little or no discernible effect on the quality of the audio being reproduced by the transducer. The psychoacoustic model selects energy to be reduced from the audio signal based, in part, on human auditory perceptions and/or speaker reproduction capability. For example, energy may be removed from psychoacoustic sub-bands in frequency ranges that are minimally audible to the listener. As another example, energy may be removed from psychoacoustic sub-bands in frequency ranges that are not reproducible by an audio transducer. In some embodiments, information regarding voltage across and current through the audio transducer may be monitored and used as part of the processing involving the psychoacoustic model. In some embodiments, thermal and excursion limiters may also be applied after reduction of input energy by the psychoacoustic model. The unwanted audible effects on the quality of the output stream from the speaker may be reduced because much of the dangerous energy has been removed by the psychoacoustic model. The reduced input signal energy to the audio transducer may reduce damage to the speaker and/or improve a quality of audio being reproduced by the speaker. In accordance with the teachings of the present disclosure, certain disadvantages and problems associated with protecting a speaker from damage can be reduced or eliminated.

In some embodiments, a speaker controller may implement a speaker protection and audio/voice enhancement technique based on the psychoacoustic concepts of sub-bands and hearing thresholds. Critical sub-bands for allocating energy in the psychoacoustic model may divide frequencies based on the human auditory system's differing perception of sound levels across frequencies, such as described in the Bark scale. For example, humans can discriminate sounds at low frequencies much better than sounds at high frequencies. Further, hearing thresholds may be assigned in the psychoacoustic model based on the fact that the human ear perceives only some stimuli when multiple sound stimuli are presented to the ear. Applying psychoacoustic processing techniques to an audio signal can modify energy from an audio signal without affecting its perceived loudness or sound quality. In particular, in some embodiments, energy that is harmful to an audio transducer may be removed from an audio signal without greatly affecting its perceived loudness. In some embodiments, energy, that when coupled with the speaker's dynamics, generates unwanted audible effects, such as distortion, rub and buzz, etc., may be removed from a sound signal. In some embodiments, energy that has been heavily compressed or is borderline audible in a sound signal may be amplified to enhance its sound quality.

According to one embodiment, a method may include receiving data corresponding to audio signals; modifying an energy content of the audio signals to form modified audio signals, wherein the modifying the energy content comprises applying a psychoacoustic model that modifies the energy content based, at least in part, on characteristics of the transducer; and outputting the modified audio signals to the transducer.

In certain embodiments, the method may include receiving time-domain audio data; transforming the time-domain audio data into frequency-domain audio data; transforming the frequency-domain audio data into sub-band domain audio data using an arbitrary mathematical transform matrix T, wherein the sub-band domain audio comprises audio data organized into N number of sub-bands; dynamically allocating compensation coefficients to the N number of sub-bands; reverse transforming the allocated compensation coefficients corresponding to the N number of sub-bands back to the frequency domain using an arbitrary reverse transform matrix Tr; multiplying the frequency-domain audio data by the dynamically allocated compensation coefficients; and/or converting the multiplied frequency-domain audio data into processed audio data, wherein the processed audio data has modified signal power compared to the received audio data. In certain embodiments, the compensation coefficients may be allocated values such that the audio data is modified to be more power efficient and sound enhanced; the method may be used to protect the speaker from at least one of over current, over voltage, over excursion, or over temperature conditions by reducing the output power to the speaker without affecting at least one of a human-perceived loudness and human-perceived sound quality of the speaker; and/or the method may be used to enhance sound effects in loudness and clarity and reduce distortion from the speaker; performing a Fast Fourier Transform (FFT) on the audio data. The dynamically-allocated compensation coefficients may be selected to reduce energy in the N number of sub-bands that is not reproducible by an output transducer and/or to reduce energy in the N number of sub-bands that is inaudible to a listener of an output transducer.

In some embodiments, the method may also include one or more of comparing power levels for the N number of sub-bands to corresponding N number of hearing thresholds; comparing power levels for the N number of sub-bands to corresponding feedback current and voltage signals from a transducer; allocating the compensation coefficients based on the steps of comparing the power levels to the hearing thresholds and the feedback current and voltage signals; calculating a hearing threshold for each of the N number of sub-bands based, at least in part, on psychoacoustic principles before the step of comparing the power levels for the N number of sub-bands to corresponding hearing thresholds; when a sub-band is below or above a corresponding hearing threshold, allocating a compensation coefficient to the sub-band to modify energy in the sub-band; when a sub-band component is below a corresponding hearing threshold by a first difference, allocate a coefficient to modify the sub-band by a first amount; when a sub-band component is below a corresponding hearing threshold by less than the first difference, allocate a coefficient to modify the sub-band by a second amount that is less than the first amount; when a sub-band component is approximately equal to a corresponding hearing threshold, allocate a coefficient to modify the sub-band; when a sub-band component is above a corresponding hearing threshold and one or more neighboring sub-bands are approximately equal to or below a corresponding hearing threshold, allocate a coefficient to modify sub-band by a third amount that is less than the first amount; outputting the processed audio data to a speaker; performing a Fast Fourier Transform (FFT) on the audio data; and/or transforming the frequency-domain audio data into sub-band domain audio data using any arbitrary mathematical transform matrix T.

According to another embodiment, an apparatus may include a controller configured to perform steps including receiving data corresponding to audio signals; modifying an energy content of the audio signals to form modified audio signals, wherein the modifying the energy content comprises applying a psychoacoustic model that modifies the energy content based, at least in part, on characteristics of the transducer; and outputting the modified audio signals to the transducer.

In certain embodiments, the controller may be configured to perform steps including: receiving audio data; transforming the audio data into frequency-domain audio data; transforming the frequency-domain audio data into sub-band domain audio data using an arbitrary mathematical transform matrix T, wherein the sub-band domain audio comprises audio data organized into N number of sub-bands; dynamically allocating compensation coefficients to the N number of sub-bands; reverse transforming the allocated compensation coefficients corresponding to the N number of sub-bands back to the frequency domain using an arbitrary reverse transform matrix Tr; multiplying the frequency-domain audio data by the dynamically allocated compensation coefficients; and/or converting the multiplied frequency-domain audio data into processed audio data, wherein the processed audio data has modified signal power compared to the received audio data. In certain embodiments the compensation coefficients may be allocated values such that the audio data is modified to be more power efficient and sound enhanced; the method may be used to protect the speaker from at least one of over current, over voltage, over excursion, or over temperature conditions by reducing the output power to the speaker without affecting at least one of a human-perceived loudness and human-perceived sound quality of the speaker; and/or the method may be used to enhance sound effects in loudness and clarity and reduce distortion from the speaker; performing a Fast Fourier Transform (FFT) on the audio data. The dynamically-allocated compensation coefficients may be selected to reduce energy in the N number of sub-bands that is not reproducible by an output transducer and/or to reduce energy in the N number of sub-bands that is inaudible to a listener of an output transducer.

In some embodiments, the apparatus may also be configured to perform steps including one or more of comparing power levels for the N number of sub-bands to corresponding N number of hearing thresholds; comparing power levels for the N number of sub-bands to corresponding feedback current and voltage signals from a transducer; allocating the compensation coefficients based on the steps of comparing the power levels to the hearing thresholds and the feedback current and voltage signals; calculating a hearing threshold for each of the N number of sub-bands based, at least in part, on psychoacoustic principles before the step of comparing the power levels for the N number of sub-bands to corresponding hearing thresholds; when a sub-band is below or above a corresponding hearing threshold, allocating a compensation coefficient to the sub-band to modify energy in the sub-band; when a sub-band component is below a corresponding hearing threshold by a first difference, allocate a coefficient to modify the sub-band by a first amount; when a sub-band component is below a corresponding hearing threshold by less than the first difference, allocate a coefficient to modify the sub-band by a second amount that is less than the first amount; when a sub-band component is approximately equal to a corresponding hearing threshold, allocate a coefficient to modify the sub-band; when a sub-band component is above a corresponding hearing threshold and one or more neighboring sub-bands are approximately equal to or below a corresponding hearing threshold, allocate a coefficient to modify sub-band by a third amount that is less than the first amount; outputting the processed audio data to a speaker; performing a Fast Fourier Transform (FFT) on the audio data; and/or transforming the frequency-domain audio data into sub-band domain audio data using any arbitrary mathematical transform matrix T.

According to another embodiment, an apparatus may be a mobile device, and the mobile device may include a transducer, such as a microspeaker; an amplifier coupled to the microspeaker, wherein the amplifier is configured to receive an input audio signal and amplify the input audio signal for reproduction on the microspeaker; and/or a controller coupled to the amplifier, wherein the controller is configured to perform steps including receiving data corresponding to audio signals; modifying an energy content of the audio signals to form modified audio signals, wherein the modifying the energy content comprises applying a psychoacoustic model that modifies the energy content based, at least in part, on characteristics of the transducer; and outputting the modified audio signals to the transducer.

In certain embodiments, the mobile device may be configured to perform steps including receiving audio data;

transforming the audio data into frequency-domain audio data; transforming the frequency-domain audio data into sub-band domain audio data using an arbitrary mathematical transform matrix T, wherein the sub-band domain audio comprises audio data organized into N number of sub-bands; dynamically allocating compensation coefficients to the N number of sub-bands; reverse transforming the allocated compensation coefficients corresponding to the N number of sub-bands back to the frequency domain using an arbitrary reverse transform matrix Tr; multiplying the frequency-domain audio data by the dynamically allocated compensation coefficients; and/or converting the multiplied frequency-domain audio data into processed audio data, wherein the processed audio data has modified signal power compared to the received audio data. In certain embodiments, the compensation coefficients may be allocated values such that the audio data is modified to be more power efficient and sound enhanced; the method may be used to protect the speaker from at least one of over current, over voltage, over excursion, or over temperature conditions by reducing the output power to the speaker without affecting at least one of a human-perceived loudness and human-perceived sound quality of the speaker; and/or the method may be used to enhance sound effects in loudness and clarity and reduce distortion from the speaker; performing a Fast Fourier Transform (FFT) on the audio data. The dynamically-allocated compensation coefficients may be selected to reduce energy in the N number of sub-bands that is not reproducible by an output transducer and/or to reduce energy in the N number of sub-bands that is inaudible to a listener of an output transducer.

In certain embodiments, the controller may also be configured to perform one or more of comparing power levels for the N number of sub-bands to corresponding N number of hearing thresholds; comparing power levels for the N number of sub-bands to corresponding feedback current and voltage signals from a transducer; allocating the compensation coefficients based on the steps of comparing the power levels to the hearing thresholds and the feedback current and voltage signals; calculating a hearing threshold for each of the N number of sub-bands based, at least in part, on psychoacoustic principles before the step of comparing the power levels for the N number of sub-bands to corresponding hearing thresholds; when a sub-band is below or above a corresponding hearing threshold, allocating a compensation coefficient to the sub-band to modify energy in the sub-band; when a sub-band component is below a corresponding hearing threshold by a first difference, allocate a coefficient to modify the sub-band by a first amount; when a sub-band component is below a corresponding hearing threshold by less than the first difference, allocate a coefficient to modify the sub-band by a second amount that is less than the first amount; when a sub-band component is approximately equal to a corresponding hearing threshold, allocate a coefficient to modify the sub-band; when a sub-band component is above a corresponding hearing threshold and one or more neighboring sub-bands are approximately equal to or below a corresponding hearing threshold, allocate a coefficient to modify sub-band by a third amount that is less than the first amount; outputting the processed audio data to a speaker; performing a Fast Fourier Transform (FFT) on the audio data; and/or transforming the frequency-domain audio data into sub-band domain audio data using any arbitrary mathematical transform matrix T.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

FIG. 5 is a table showing an example set of sub-bands that may be used for transform of audio data into the sub-band domain according to some embodiments of the disclosure.

DETAILED DESCRIPTION

Figure 1:
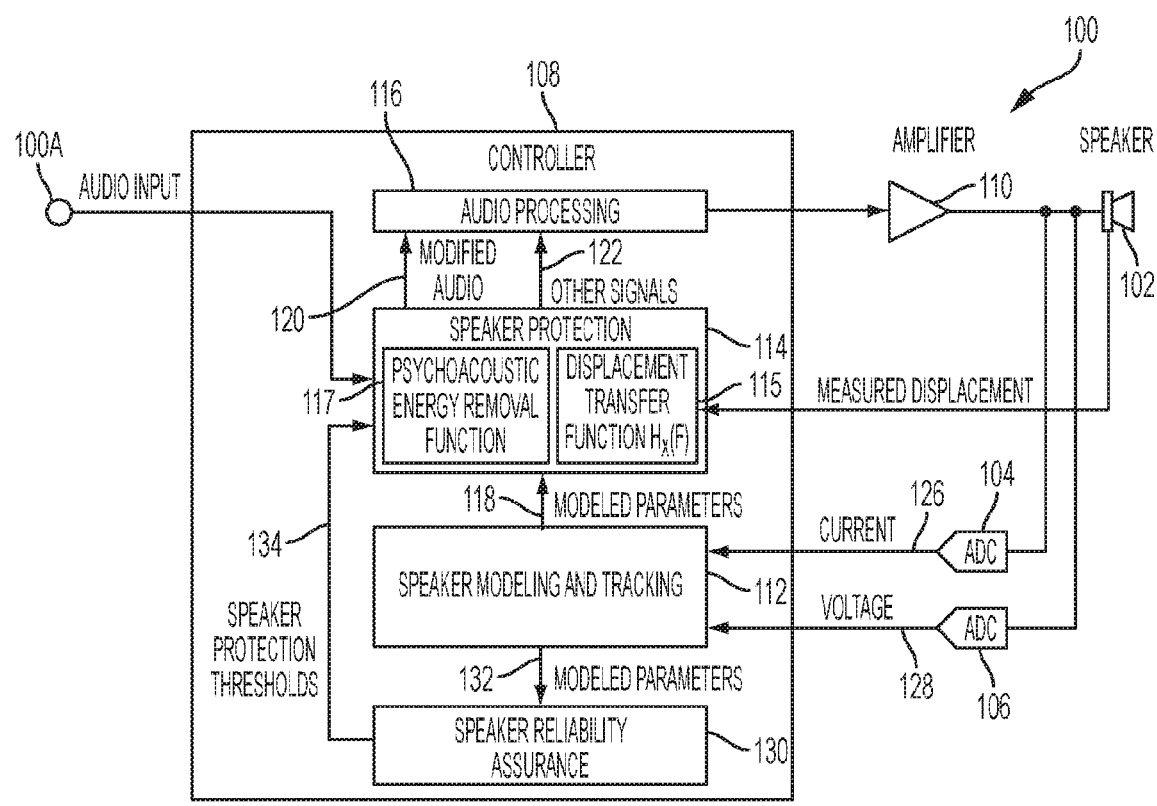
FIG. 1 is a block diagram illustrating an example system that employs a controller to control the operation of an audio speaker in accordance with embodiments of the present disclosure.

FIG. 1 illustrates a block diagram of an example system 100 that employs a controller 108 to control the operation of an audio speaker 102, in accordance with embodiments of the present disclosure. Audio speaker 102 may be any suitable electroacoustic transducer that produces sound in response to an electrical audio signal input (e.g., a voltage or current signal). The audio speaker 102 may be integrated with a mobile device, such as a microspeaker in a mobile device, or the audio speaker 102 may be integrated in headphones connected to a mobile device. As shown in FIG. 1, controller 108 may generate the electrical audio signal input for the speaker 102, which may be amplified by amplifier 110 to drive the speaker 102. In some embodiments, one or more components of system 100 may be integrated in a single integrated circuit (IC). For example, the controller 108, the amplifier 110, and the ADCs 104 and 106 may be integrated into a single IC, such as an audio coder/decoder (CODEC).

Controller 108 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, controller 108 may interpret and/or execute program instructions and/or process data stored in a memory (not shown) coupled to the controller 108.

The controller 108 may be logic circuitry configured by software or configured with hard-wired functionality that performs functions of the illustrated modules of FIG. 1, along with other functionality not shown. For example, as shown in FIG. 1, controller 108 may be configured to perform speaker modeling and tracking in module 112, speaker protection in module 114, audio processing in module 116, and/or speaker reliability assurance in module 130.

Amplifier 110, although shown as a single component, may include multiple components, such as a system, device, or apparatus configured to amplify a signal received from the controller 108 and convey the amplified signal to another component, such as to speaker 102. In some embodiments, amplifier 110 may include digital-to-analog converter (DAC) functionality. For example, the amplifier 110 may be a digital amplifier configured to convert a digital signal output from the controller 108 to an analog signal to be conveyed to speaker 102.

The audio signal communicated to speaker 102 may be sampled by each of an analog-to-digital converter (ADC) 104 and an analog-to-digital converter (ADC) 106 and used as feedback within the controller 108. For example, ADC 104 may be configured to detect an analog current value and ADC 106 may be configured to detect an analog voltage value. These analog values may be converted to digital signals by ADCs 104 and 106 and conveyed to the controller 108 as digital signals 126 and 128, respectively. Based on digital current signal 126 and digital voltage signal 128, controller 108 may perform speaker modeling and tracking 112 in order to generate modeled parameters 118 (e.g., parameters indicative of a displacement associated with audio speaker 102 and/or a temperature associated with audio speaker 102) and modeled parameters 132 (e.g., parameters indicative of a force factor, a stiffness, damping factor, resonance frequency associated with audio speaker 102) for speaker 102.

Based on modeled parameters 132 (e.g., parameters indicative of a force factor, a stiffness, damping factor, resonance frequency associated with audio speaker 102) and/or offline reliability testing of audio speakers similar (e.g., of the same make and model) to audio speaker 102, controller 108 may perform speaker reliability assurance 130 to generate speaker protection thresholds 134. Such speaker protection thresholds 134 may include, without limitation, an output power level threshold for audio speaker 102, a displacement threshold associated with audio speaker 102, and a temperature threshold associated with audio speaker 102.

Controller 108 may perform speaker protection 114 based on one or more operating characteristics of the audio speaker, including modeled parameters 118 and/or the audio input signal. For example, speaker protection 114 may compare modeled parameters 118 (e.g., a modeled displacement and/or modeled resistance of audio speaker 102) to corresponding speaker protection thresholds 134 (e.g., a displacement threshold and/or a temperature threshold), and based on such comparison, generate control signals for gain, bandwidth, and virtual bass conveyed as other signals 122 to the audio processing circuitry 116. As another example, speaker protection 114 may apply displacement transfer function 115 to the audio input signal to predict a predicted displacement associated with audio speaker 102, and compare such predicted displacement to a corresponding speaker protection threshold 134 (e.g., a displacement threshold), and based on such comparison, generate control signals for, e.g., gain, bandwidth, and virtual bass. Thus, by comparing a modeled displacement (as included within modeled parameters 118) or a predicted displacement (as predicted based on displacement transfer function 115) to an associated displacement threshold, speaker protection 114 may reduce gain in order to reduce the intensity of the audio signal communicated to speaker 102 and/or control bandwidth in order to filter out lower-frequency components of the audio signal which may reduce displacement of audio speaker 102, while causing virtual bass to virtually add such filtered lower-frequency components to the audio signal. Additionally, or alternatively, by comparing a modeled resistance (as included within modeled parameters 118) to an associated temperature threshold, speaker protection 114 may reduce gain in order to reduce the intensity of the audio signal communicated to speaker 102 and the heat generated by speaker 102. Additional description relating to displacement transfer function 115, speaker modeling and tracking 112, and speaker reliability assurance 130 may be found in U.S. Pat. No. 9,161,126, which is hereby incorporated by reference.

In addition to performing speaker protection 114 based on comparison of one or more operating characteristics of speaker 102, speaker modeling and tracking 112 may ensure that speaker 102 operates under an output power level threshold for audio speaker 102. In some embodiments, such output power level threshold may be included within speaker protection thresholds 134.

In some embodiments, speaker protection 114 may be performed by using a displacement transfer function 115 that defines an expected speaker displacement as a function of a frequency of an audio signal communicated to audio speaker 102. In these embodiments, such displacement transfer function 115 may be based on offline testing and characterization and/or may be dynamically updated during operation of system 100 by actual measurement of displacement associated with and/or by modeling displacement in real time (e.g., such modeled displacement may be a part of modeled parameters 118 generated by speaker modeling and tracking 112).

In some embodiments, speaker protection 115 may also be performed by using a psychoacoustic energy removal function 117. The psychoacoustic energy removal function 117 may analyze the audio input signal and determine energy that can be removed from the audio signal without affecting the listener's perception of the sounds in the audio signal. In one embodiment, the energy may be removed using psychoacoustic analysis. In other embodiments, other processes may be used in addition or in alternative to the psychoacoustic analysis to modify the audio input to reduce energy sent to the speaker 102. The psychoacoustic energy removal function 117 may receive the audio input signal and generate a modified audio input that is provided to audio processing 116 for reproduction at the speaker 102. The modified audio input may have reduced energy content to reduce the likelihood of damage to the speaker 102. Based on the modified audio signal 120 and other signals 122, the controller 108 may perform audio processing 116, whereby it applies the other control signals 122, such as gain, bandwidth, and/or virtual bass to generate a processed audio signal that controller 108 conveys to amplifier 110.

Figure 2:
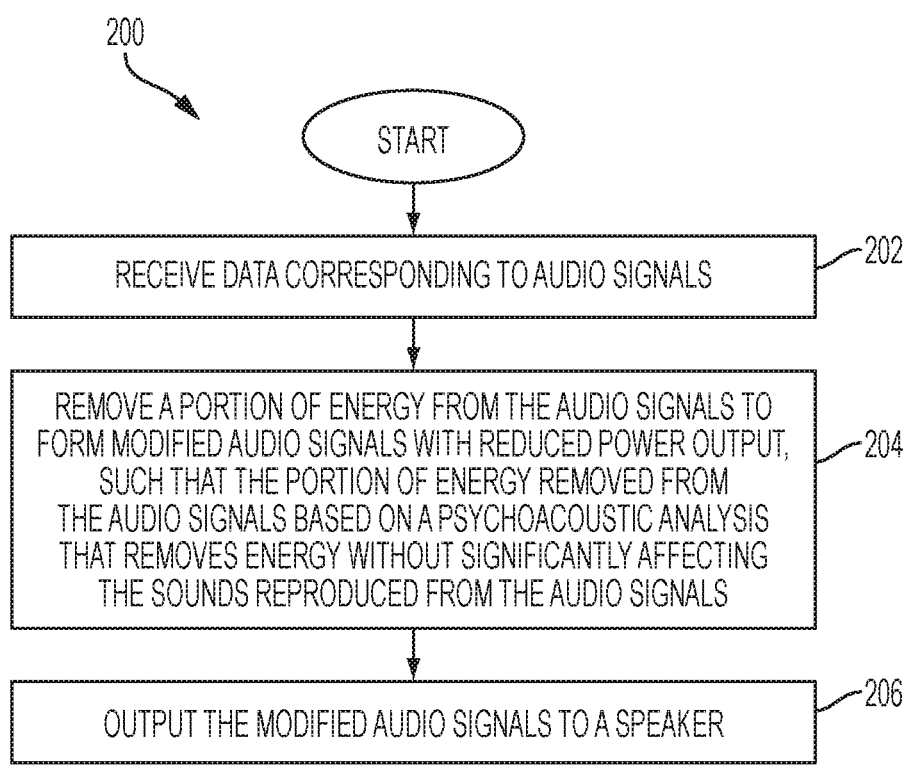
FIG. 2 is a flow chart of an example method for processing audio data according to some embodiments of the disclosure.

One method that may be performed by the controller 108 is shown in FIG. 2. FIG. 2 is a flow chart of an example method for processing audio data according to some embodiments of the disclosure. A method 200 begins at block 202 with receiving data corresponding to audio signals, such as when the controller 108 receives an audio input signal at input node 100A. The audio signal may be, for example, a pulse-code modulated (PCM) audio stream. Then, at block 204, a portion of energy from the audio signals is removed to form modified audio signals having reduced power levels. The portion of energy removed from the audio signals may be based on a psychoacoustic analysis that removes energy without significantly affecting the sounds reproduced from the audio signals. The psychoacoustic analysis may be based on information regarding the transducer being used to playback the audio signals. For example, the psychoacoustic analysis may be performed to modify the energy levels for better playback on the transducer, such as to remove energy that would damage a transducer. Microspeakers in particular may be limited power handling capability due to their small size, and the psychoacoustic model may modify energy content in view of the transducer's capabilities or current conditions. The energy removal may be performed, for example, by speaker protection module 115 of the controller 108. Within the speaker protection module 115, a psychoacoustic energy removal function 117 may implement psychoacoustic processing to perform the energy removal of block 204. Certain processing algorithms for removing the energy at block 204 are described in further detail below. However, these algorithms are examples only and not limiting of the functionality of the energy removal of block 204. The modified audio signal produced by removing energy at block 204 may be output to a speaker or other transducer at block 206. For example, a modified audio signal 120 produced by the speaker protection module 114 may be provided to audio processing 116, then to amplifier 110, and then to speaker 102. Although removing energy is described as one process for modifying the energy content of the audio signals, other modifications may be performed that may include adding energy in certain sub-bands as described in other embodiments below.

Figure 3A:
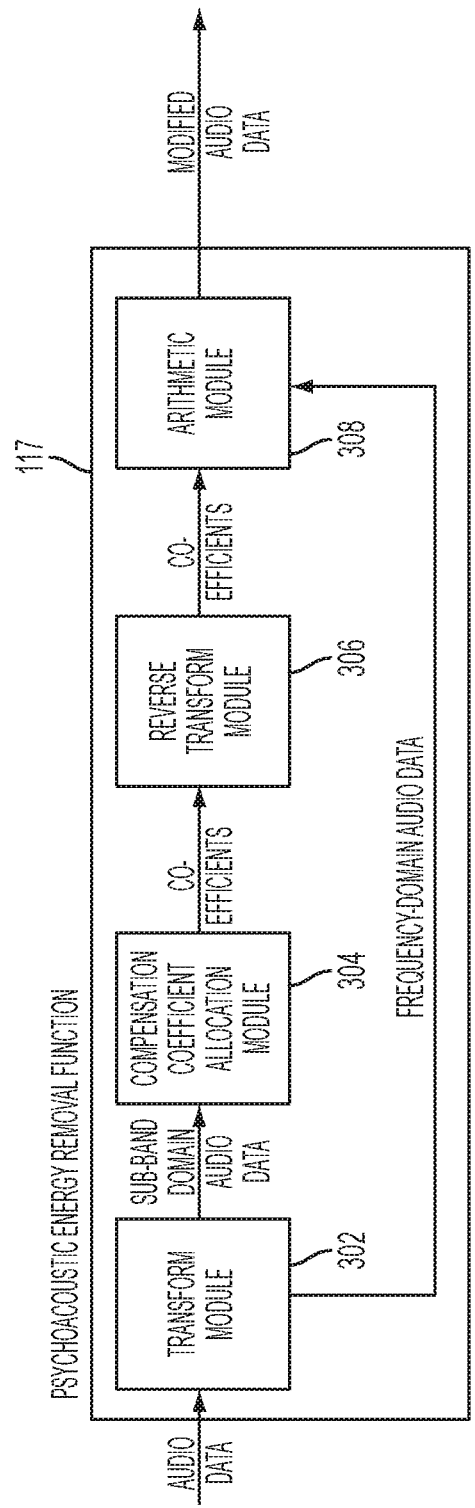
FIG. 3A is a block diagram illustrating example processing for removing energy from an audio signal using psychoacoustic models according to some embodiments of the disclosure.

One embodiment of the psychoacoustic energy removal function 117 of controller 108 is shown in FIG. 3A. FIG. 3A is a block diagram illustrating example processing for removing energy from an audio signal using psychoacoustic models according to some embodiments of the disclosure. The psychoacoustic energy removal function 117 may include transform module 302, compensation coefficient allocation module 304, reverse transform module 306, and arithmetic module 308. The transform module 302 may receive an input audio signal and transform the audio data between different representations. For example, audio data may be received as a time-domain audio signal and transformed by the transform module 302 into one or more of frequency-domain audio data and a sub-band domain audio data. Sub-band domain audio data may be provided to compensation coefficient allocation module 304; and frequency-domain audio data may be provided to the arithmetic module 308. The compensation coefficient allocation module 304 may use the sub-band domain audio data to allocate coefficients to different sub-bands within the audio data to modify the audio signal to remove energy from certain spectrum and/or add energy to certain spectrum. The generated coefficients may be provided to reverse transform module 306. The reverse transform module may transform the sub-band domain coefficients to frequency-domain coefficients. The arithmetic module 308 may receive the frequency-domain coefficients from the reverse transform module 306 and the frequency-domain audio data from the transform module 302 and process them to produce processed audio data. For example, the arithmetic module 308 may multiply the frequency-domain coefficients with the frequency-domain audio data to generate processed audio data. The processed audio data may or may not be converted back to time-domain audio data within the arithmetic module 308.

Figure 3B:
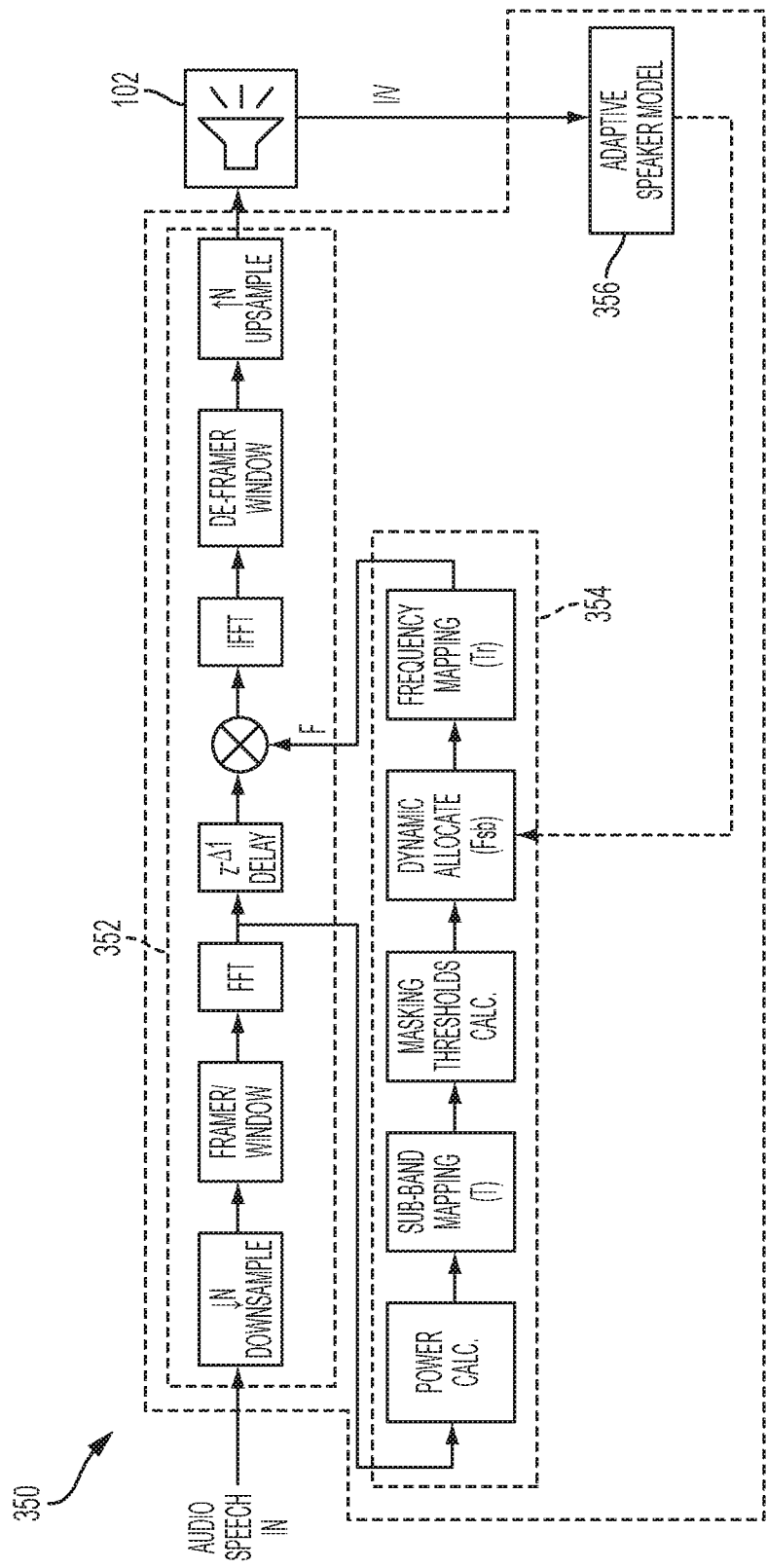
FIG. 3B is a block diagram illustrating an example audio controller for processing audio using psychoacoustic models according to some embodiments of the disclosure.

One implementation of the modules shown in FIG. 3A in an audio controller is shown in FIG. 3B. FIG. 3B is a block diagram illustrating an example audio controller for processing audio using psychoacoustic models according to some embodiments of the disclosure. An audio controller 350 may be configured to couple to a speaker 102 for outputting signals that cause reproduction of sounds in the input audio or speech data. The audio controller 350 may include transform and processing circuitry 352, coefficient allocation circuitry 354, and/or adaptive speaker model circuitry 356. The transform and processing circuitry 352 may perform functionality relating to the transform module 302, the reverse transform module 306, and the arithmetic module 308 of FIG. 3A. The transform and processing circuitry 352 may include, for example, downsampling circuitry, upsampling circuitry, windowing circuitry, de-windowing circuitry, delay circuitry, Fast Fourier Transform (FFT) circuitry, and/or inverse Fast Fourier Transform (IFFT) circuitry. The coefficient allocation circuitry 354 may perform functionality relating to the compensation coefficient allocation module 304. The coefficient allocation circuitry 354 may include power calculation circuitry, sub-band mapping circuitry, masking threshold calculation circuitry, dynamic coefficient allocation circuitry, and frequency mapping circuitry. The adaptive speaker model circuitry 356 may perform functionality relating to the speaker modeling and tracking module 112 of FIG. 1.

Figure 4:
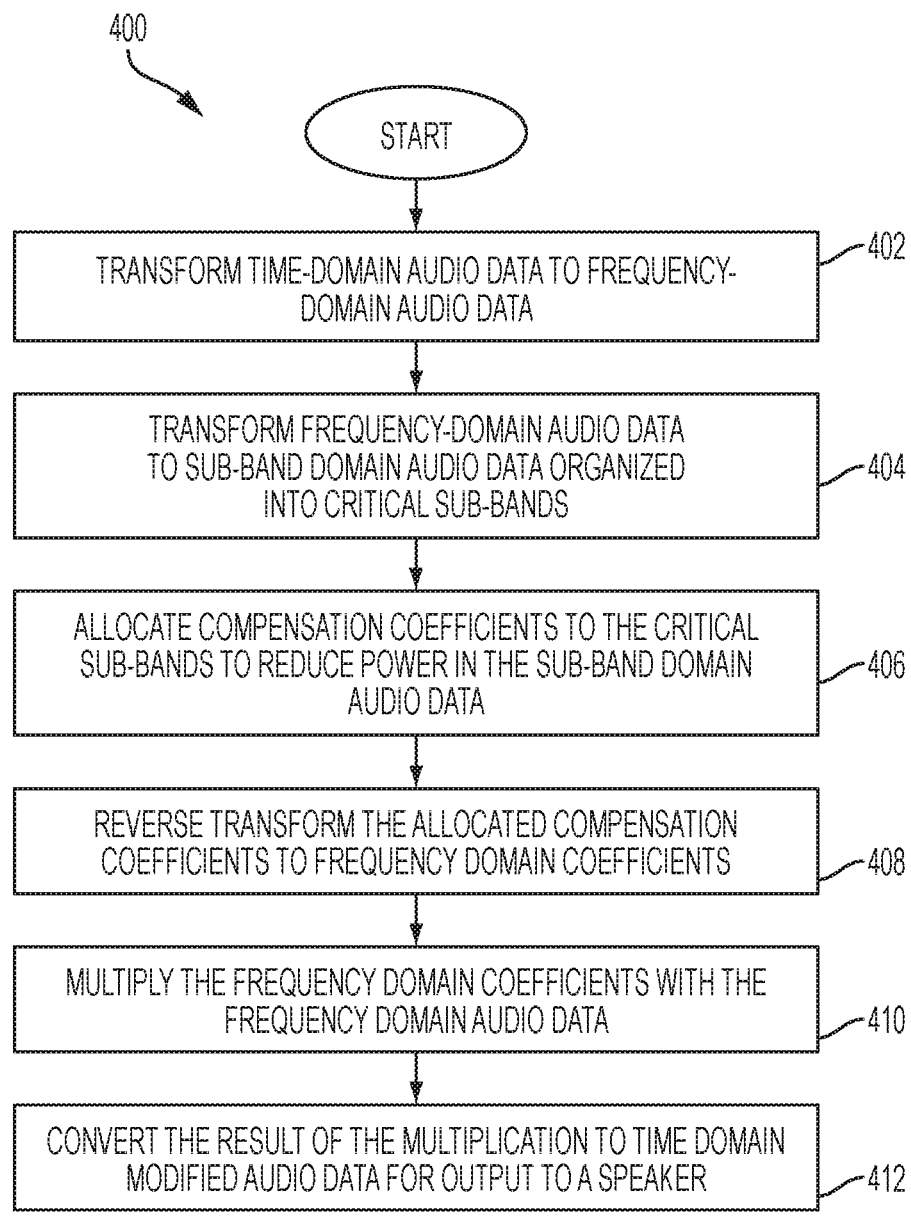
FIG. 4 is a flow chart illustrating an example algorithm for processing audio according to some embodiments of the disclosure.

One example algorithm for processing audio data that may be performed by the embodiment of the psychoacoustic energy removal function 117 described with reference to FIG. 3A is shown in FIG. 4. FIG. 4 is a flow chart illustrating an example algorithm for processing audio according to some embodiments of the disclosure. Although execution of the algorithm of FIG. 4 may be described with reference to the psychoacoustic energy removal function 117 embodiment of FIG. 3A, some or all of the audio processing described with reference to FIG. 4 may be performed by different hardware and/or software within the controller 108, or within other audio circuitry separate from the controller 108. A method 400 may begin at block 402 with transforming time-domain audio data to frequency-domain audio data. Next, at block 404, the frequency-domain audio data may be transformed to sub-band domain audio data organized into sub-bands. The transformations of block 402 and 404 may be performed within, for example, transform module 302 of FIG. 3A or within other processing circuitry of the controller 108 of FIG. 1.

A number of data processing algorithms are available for performing the transformations of blocks 402 and 404. Regarding the transformation from time-domain to frequency-domain of block 402, in some embodiments a Fourier Transform, a Fast Fourier Transform (FFT), or wavelet transforms may be applied to the time-domain data to obtain frequency-domain data. Regarding the transformation to sub-band domain data, the sub-band domain data may be obtained either by transforming the original time-domain data to the frequency-domain data from block 402. After sub-band domain transform, energy from various frequencies may be grouped into sub-bands, wherein each sub-band may be characterized by a center frequency, a cut-off frequency, and a bandwidth. The number of sub-bands and the content of each sub-band may be selected based on how the human ear perceives audio data and may be selected according to a psychoacoustic model. One example of divisions of sub-bands for the sub-band domain transform is shown in the table of FIG. 5. FIG. 5 is a table showing an example set of sub-bands that may be used for transform of audio data into the sub-band domain according to some embodiments of the disclosure. The table includes rows corresponding to sub-bands 502, each with a center frequency shown in column 504, a cut-off frequency shown in column 506, and a bandwidth shown in column 508.

After transformation, the audio signals may be processed using the frequency-domain and/or sub-domain audio data to remove energy from the audio signal and produce a modified audio signal as described in block 204 of FIG. 2. Referring back to FIG. 4, at block 406, compensation coefficients may be allocated to the sub-bands to modify power in each of the sub-band domains of the audio data. The compensation coefficients may be selected to increase or decrease energy in each of the sub-bands, but the overall change across all sub-bands may result in a net reduction in energy within the audio signal. The compensation coefficients may be calculated within the compensation coefficient allocation module 304 of FIG. 3A, other circuitry within the controller 108 of FIG. 1, or other circuitry outside of the controller 108. The compensation coefficients may be calculated dynamically during real-time playback of audio signals. Further, the dynamic allocation of compensation coefficients may adapt to changing conditions of the speaker, amplifier, or other aspects of the mobile device.

The compensation coefficients may be allocated by applying a psychoacoustic model to determine energy within the audio signal that has little or no effect on how the sounds in the audio signal are perceived by a listener. For example, a hearing threshold may be established for the sub-bands used in the transformation of block 404 of FIG. 4. That hearing threshold may establish the hearing limit for energy within each of the sub-bands. The sub-band domain audio data of an input audio signal may be compared to the hearing threshold to determine energy within the audio data that has little or no impact on a listener's perception of the sounds in the audio data. The compensation coefficients may then be allocated to modify the energy to remove some or all of the energy in each of the sub-bands that is above the hearing threshold. In some embodiments, some compensation coefficients may also be selected to increase the energy within certain sub-bands where the energy is below the hearing threshold. The hearing thresholds may also be based on characteristics of the speaker 102 that affect reproduction of audio signals by the speaker 102. For example, when the speaker 102 is a microspeaker that is incapable of reproducing certain audio signals or reproduces them with low quality, the hearing thresholds may reflect that and be selected to remove such unreproducible energy from the audio signal. Microspeakers herein may refer to speakers designed to fit in compact spaces, such as spaces found within mobile devices including mobile phones, tables, and laptop computers, and such as spaces found in in-ear headphones or other headphones. Microspeakers may have reduced power handling capability compared with larger speakers and have limited frequency reproduction ranges or fidelity due to their smaller sizes.

Figure 6:
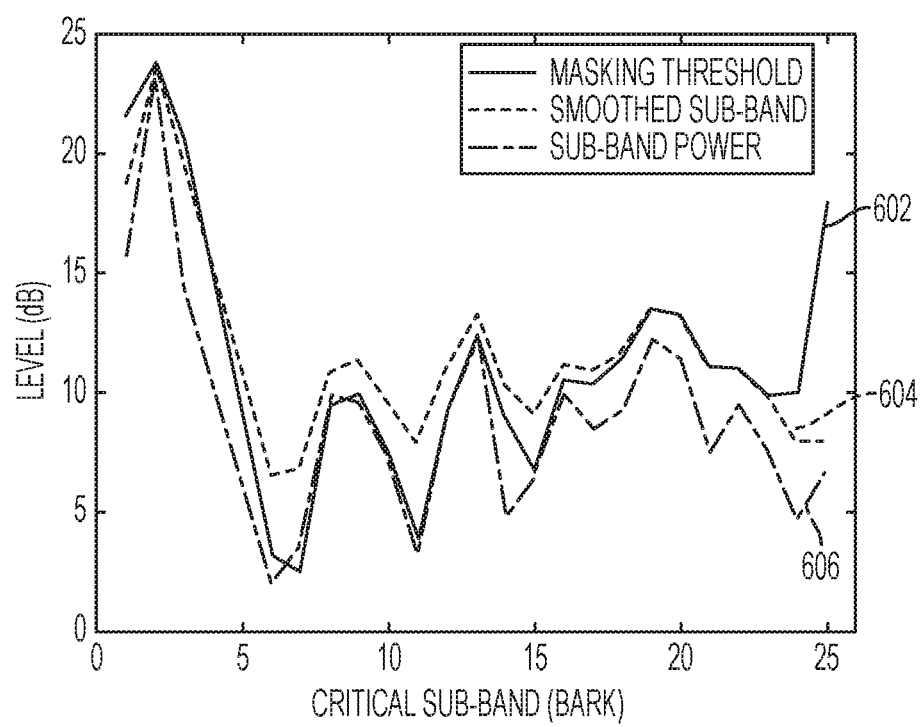
FIG. 6 is a sub-band domain representation of audio data from one example audio signal according to one embodiment of the disclosure.
Figure 7:
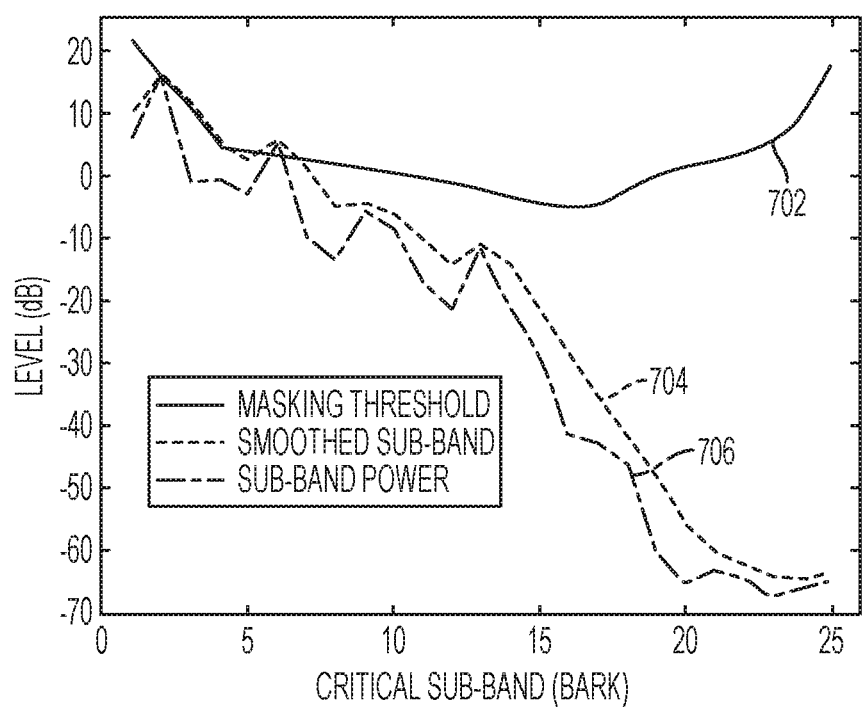
FIG. 7 is another sub-band domain representation of audio data from another example audio signal according to one embodiment of the disclosure.

Examples of audio signals transformed into the sub-band domain along with hearing thresholds are shown in FIG. 6 and FIG. 7. FIG. 6 is a sub-band domain representation of audio data from one example audio signal according to one embodiment of the disclosure. A line 606 shows the power level in decibels (dBs) for each of the sub-bands of the example audio signal. A line 604 shows smoothing of the line 606 across sub-bands. A line 602 shows a hearing threshold that may be applied to the sub-band energy levels for the example audio signal. FIG. 7 is another sub-band domain representation of audio data from another example audio signal according to one embodiment of the disclosure. A line 706 shows the power level in decibels (dBs) for each of the sub-bands of the example audio signal. A line 704 shows smoothing of the line 706 across sub-bands. A line 702 shows a hearing threshold that may be applied to the sub-band energy levels for the example audio signal.

Figure 8:
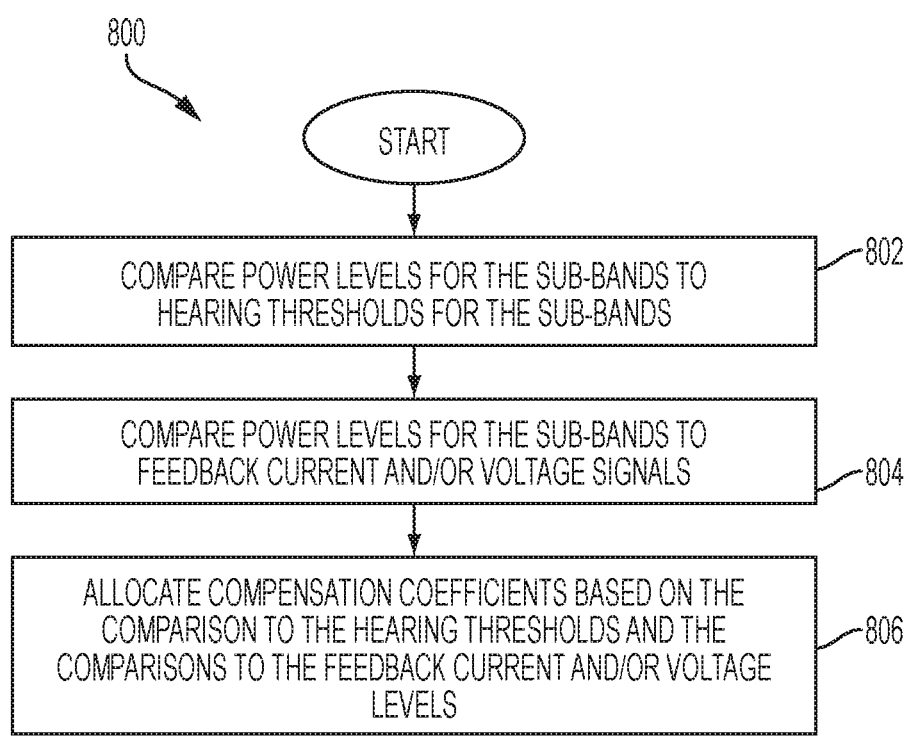
FIG. 8 is a flow chart illustrating an example method of allocating compensation coefficients according to some embodiments of the disclosure.
Figure 9:
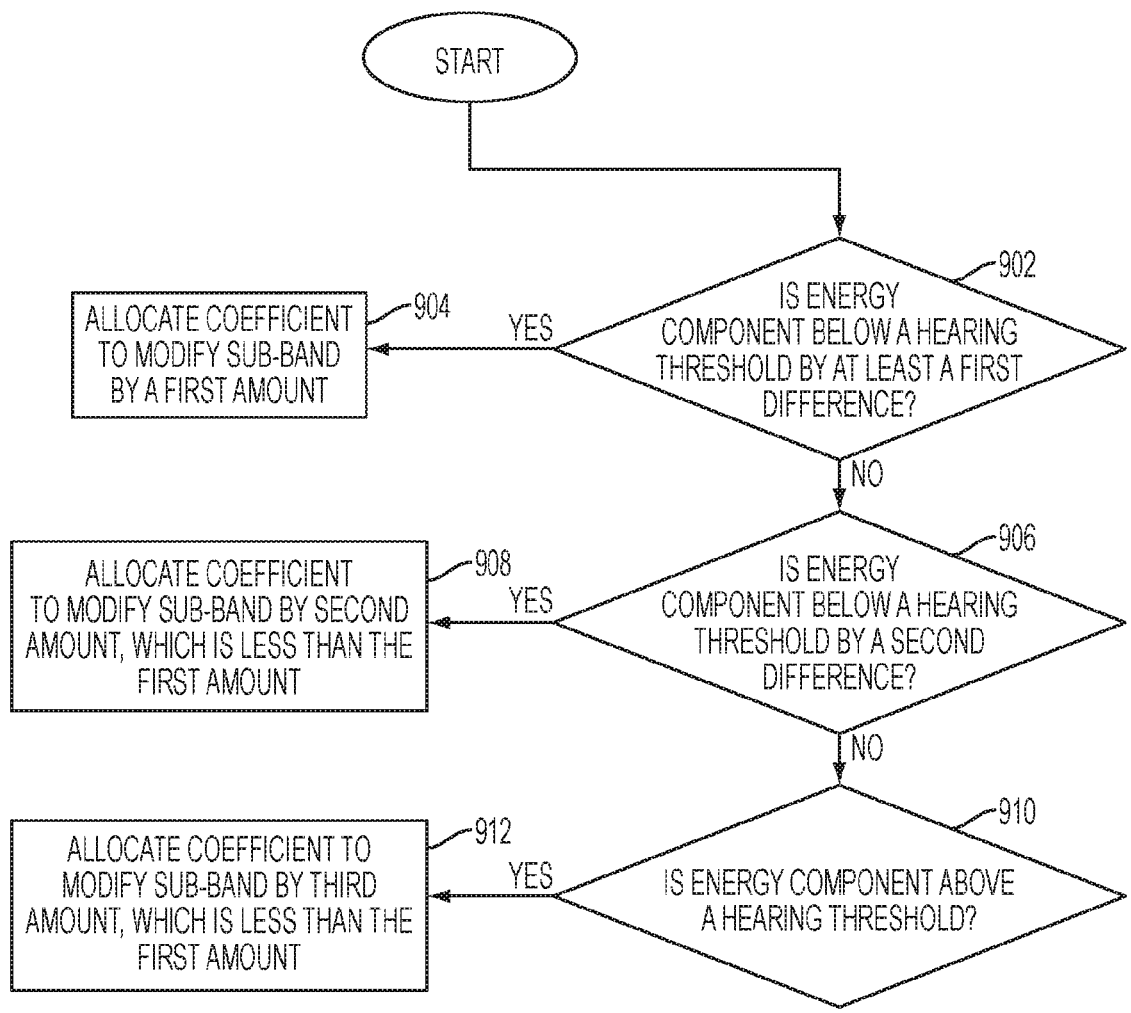
FIG. 9 is a flow chart illustrating an example method of allocating compensation coefficients using a hearing threshold according to some embodiments of the disclosure.

The allocation of compensation coefficients using the hearing threshold is described in further detail in FIG. 8 and FIG. 9. FIG. 8 is a flow chart illustrating an example method of allocating compensation coefficients according to some embodiments of the disclosure. A method 800 may begin at block 802 with comparing power levels for the sub-bands to hearing thresholds for the sub-bands. Then, at block 804, power levels for the sub-bands may be compared to feedback current and/or voltage signals obtained by monitoring audio output at the speaker. In one embodiment, block 804 may be performed within the speaker protection module 114 based on data received from the speaker modeling and tracking module 112, which receives feedback signals from ADCs 104 and 106 of FIG. 1. The speaker modeling and tracking module 112 may produce modeled parameters relating to the current condition of the speaker 102, such that the energy removal process in psychoacoustic energy removal function 117 may adapt to changing conditions of the speaker 102, such as heating within the speaker 102 that reduces the amount of energy that the speaker 102 can handle. Then, at block 806, compensation coefficients may be allocated based on the comparison with the hearing threshold of block 802 and the comparison with the feedback values of block 804. Although coefficient allocation in the example method of FIG. 8 is based on both of the comparisons of blocks 802 and 804, the coefficient allocation may be based on one of the comparisons alone or based on other comparisons or calculations.

Additional details regarding the allocation of compensation coefficients based on the comparison to hearing thresholds of block 802 and 806 of FIG. 8 are described with reference to FIG. 9. FIG. 9 is a flow chart illustrating an example method of allocating compensation coefficients using a hearing threshold according to some embodiments of the disclosure. A method 900 may begin at block 902 with determining whether an energy component for a sub-band is below a hearing threshold by at least a first amount (e.g., a first difference). When the energy component is below the threshold by a first amount, the method 900 may allocate a coefficient to modify the energy in the sub-band by a first amount at block 904. If not, the method 900 may continue to block 906 to determine if the energy component for the sub-band is below the hearing threshold by at least a second smaller amount. If so, the method 900 may allocate a coefficient to modify the energy in the sub-band by a second amount at block 908, which is less than the first amount of block 904. If not, the method 900 may continue to block 910 to determine if the energy component for the sub-band is above a hearing threshold. If so, the method 900 may allocate a coefficient to modify the sub-band energy by a third amount at block 912, which is less than the first amount of block 904. Although three different conditions are tested against an energy level of a sub-band, more or less conditions may be tested. For example, blocks 906 and 908 may be omitted from the coefficient allocation process. In another example, blocks 902, 904, 906, and 908 may be omitted from the coefficient process.

Figure 10A:
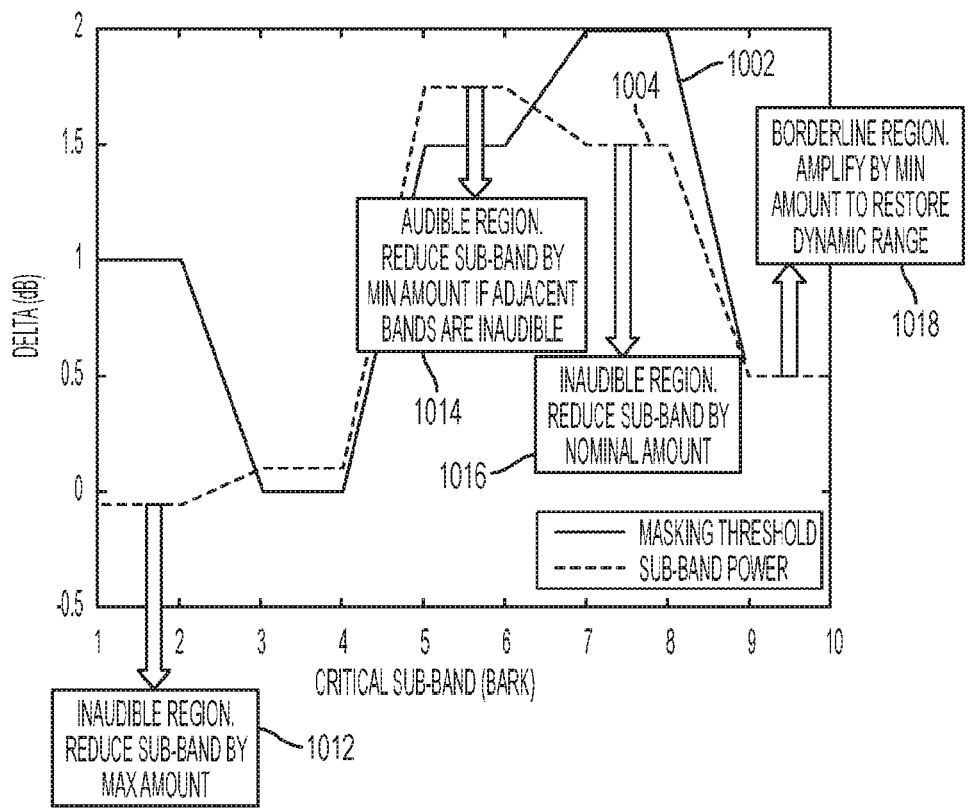
FIG. 10A is a graph illustrating an example allocation of compensation coefficients based on a hearing threshold according to some embodiments of the disclosure.

One example of source code for performing the compensation coefficient allocation is shown below:
//COMPARE N HEARING THRESHOLDS TO
//N SUB-BAND POWER LEVELS TO GENERATE
//M NUMBER OF COMPENSATION LEVELS
FOR I=1 TO N
   DELTA(I)=SUB-BAND_POWER(I)−MASKING_THRESHOLD(I)
   IF DELTA(I)<LEVEL(1) THEN COEFFICIENT(I)= COMPENSATSION_VALUE(1)
   ELSEIF DELTA(I)<LEVEL(2) THEN COEFFICIENT(I)= COMPENSATION_VALUE(2)
   ELSEIF DELTA(I)<LEVEL(3) THEN COEFFICIENT(I)= COMPENSATION_VALUE(3)
   . . .
   ELSEIF DELTA(I)<LEVEL(M) THEN COEFFICIENT(I)=COMPENSATION_VALUE(M)
END In some embodiments, coefficients may be allocated for each sub-band based on energy levels in neighboring sub-bands. FIG. 10A is a graph illustrating an example allocation of compensation coefficients based on a hearing threshold according to some embodiments of the disclosure. The graph of FIG. 10A illustrates one approach to allocating coefficients based on an energy level of a sub-band and neighboring sub-bands. However, some coefficients may be allocated within the input audio signal based only on one sub-band energy level. A line 1004 illustrates an energy level of an input audio signal. A line 1002 illustrates a hearing threshold applied to the sub-bands. A sub-band 1012 illustrates a sub-band with a low energy level in the input audio signal. Because the energy level is low, the energy is likely inaudible to the human ear, and thus a coefficient may be allocated to sub-band 1012 that reduces the energy down to a lower or zero amount. A sub-band 1014 illustrates a sub-band with an energy level in an audible region. A coefficient may be allocated to the sub-band 1014 to reduce the energy by a minimum amount if adjacent sub-bands are inaudible. A sub-band 1016 illustrates a sub-band with an energy level in an inaudible region. A coefficient may be allocated to the sub-band 1016 to reduce the energy by a nominal amount. A sub-band 1018 illustrates a sub-band with a borderline energy level for hearing. A coefficient may be allocated to the sub-band 1018 to amplify or reduce energy in the sub-band by a small amount to restore dynamic range or to protect a speaker.

Figure 10B:
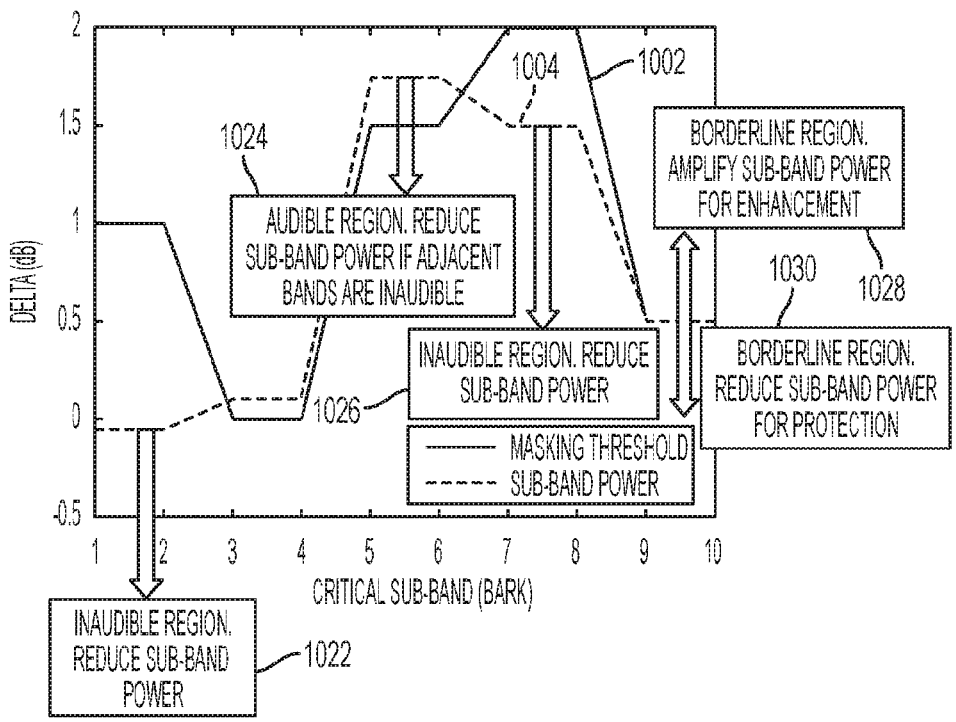
FIG. 10B is a graph illustrating an example allocation of compensation coefficients based on a hearing threshold according to some embodiments of the disclosure.

Another example of coefficient allocation is shown in FIG. 10B for the same audio data. FIG. 10B is a graph illustrating an example allocation of compensation coefficients based on a hearing threshold according to some embodiments of the disclosure. The lines 1002 and 1004 show a masking threshold and sub-band power for an audio signal, respectively. A sub-band 1022 illustrates a sub-band with a low energy level in the input audio signal. Because the energy level is low, the energy is likely inaudible to the human ear, and thus a coefficient may be allocated to sub-band 1012 that reduces the energy down to a lower amount. A sub-band 1024 illustrates a sub-band with an energy level in an audible region. A coefficient may be allocated to the sub-band 1024 to reduce the energy by some amount if adjacent sub-bands are inaudible. A sub-band 1026 illustrates a sub-band with an energy level in an inaudible region. A coefficient may be allocated to the sub-band 1026 to reduce the energy. Sub-band 1028 and 1030 illustrate a sub-band with a borderline energy level for hearing. A coefficient may be allocated as shown in box 1028 to amplify the sub-band for audio enhancement, such as to restore dynamic range. A coefficient may alternatively be allocated as shown in box 1030 to reduce power to protect a speaker.

Referring back to FIG. 4, after coefficients are allocated to each of the sub-bands, the audio data may be processed using the coefficients to obtain a modified audio signal that may be conveyed to circuitry to cause the reproduction of sounds in the audio data at a speaker or other transducer. At block 408, the allocated compensation coefficients of block 406 may be reverse transformed from the sub-band domain to the frequency-domain. At block 410, the frequency-domain coefficients obtained from reverse transformation at block 408 may be multiplied with frequency-domain audio data from block 402. The result of the multiplication is frequency-domain audio data for a processed audio signal, wherein the energy content of the processed audio signal is reduced to prevent damage to an output speaker and/or to improve sound quality of the output speaker. The frequency-domain audio data of the processed audio signal may be converted to time-domain audio data at block 412 for output, either directly or indirectly through other circuitry, to a speaker or other transducer. The processing of blocks 408, 410, and/or 412 may be implemented in the reverse transform module 306 and/or the arithmetic module 308 of FIG. 3A, other circuitry within the controller 108 of FIG. 1, or other circuitry outside of the controller 108.

Figure 11:
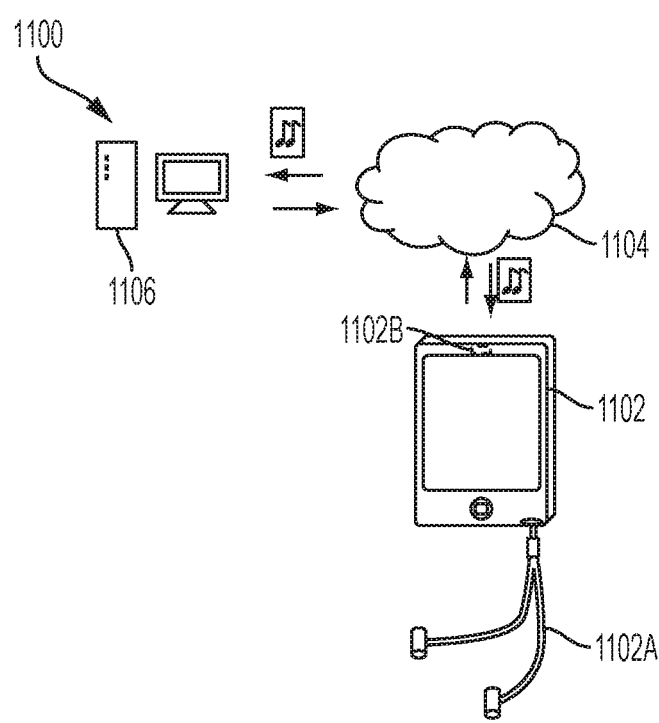
FIG. 11 is a block diagram illustrating processing of audio at a remote location from a mobile device according to one embodiments of the disclosure.

Embodiments above describe a mobile device performing audio processing during playback of audio to a transducer. However, the audio processing may be performed at other locations. For example, when the mobile device is playing back a file downloaded from a server or streamed from a server, the server may perform the audio processing described above to modify an audio signal to remove energy to make the audio more suitable for playback at the mobile device. Further, such energy removal may reduce bandwidth and data usage by the mobile device. FIG. 11 is a block diagram illustrating processing of audio at a remote location from a mobile device according to one embodiment of the disclosure. A system 1100 may include a server 1106 communicated with a mobile device 1102 over a network 1104, such as the Internet, a local area network (LAN), or another wide area network (WAN). The mobile device 1102 may download audio files from the server 1106 for playback through headphones 1102A or loudspeaker 1102B. The audio files may contain audio signals that are processed by the mobile device 1102 to remove energy to reduce damage to the headphones 1102A or loudspeaker 1102B or improve audio quality of the headphones 1102A or loudspeaker 1102B. In one embodiment, an application processor of the mobile device 1102 may decode a compressed audio file, such as an MP3 file, and pass audio signals to an audio controller, such as audio controller 108 of FIG. 1, to remove energy and produce an output for the headphones 1102A or loudspeaker 1102B. In another embodiment, the audio file downloaded to the mobile device 1102 may include partially-processed audio for playback through the headphones 1102A or loudspeaker 1102B, in which the partially-processed audio is produced by server 1106 to remove certain energy based on psychoacoustic principles. The mobile device 1102 may perform further processing to adapt the audio signals based on real-time characteristics of the headphones 1102A or loudspeaker 1102B. In a further embodiment, the audio file may be streamed to the mobile device 1102 in real-time and the mobile device 1102 may process the streamed audio in real-time to remove energy and output audio to headphones 1102A or loudspeaker 1102B. In still a further embodiment, the audio file may be streamed to the mobile device 1102 in real-time and the server 1106 may perform psychoacoustic processing on the streamed audio data to remove energy based on information regarding the mobile device 1102, the headphones 1102A, and/or loudspeaker 1102B. Further, in some embodiments, the mobile device 1102 may communicate information to the server 1106 such as current conditions (e.g., temperature) of the transducers in the headphones 1102A or loudspeaker 1102B, to enable adaptation of the psychoacoustic analysis by the server 1106.

The modification of energy levels in audio signals, such as through the use of psychoacoustic models described above, may be used to provide speaker protection functionality. For example, modified audio signals produced through the allocation of compensation coefficients may reduce excursion and displacement in a speaker; control temperature in a speaker; and/or reduce power in a speaker. The modified audio signals may be obtained by selected dynamically-allocated compensation coefficients to reduce energy in the N number of sub-bands that is not reproducible by an output transducer and/or to reduce energy in the N number of sub-bands that is inaudible to a listener of an output transducer.

The modification of energy levels in audio signals, such as through the use of psychoacoustic models described above, may also or alternatively be used to provide audio enhancement to perform sub-band expansion and compression. For example, dynamic range and sound pressure level (SPL) may be modified through the allocation of compensation coefficients using psychoacoustic models.

The schematic flow chart diagrams of FIG. 2, FIG. 4, FIG. 8, and FIG. 9 are generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method for processing audio data for output to a transducer, comprising:
receiving data corresponding to audio signals;
modifying an energy content of the audio signals to form modified audio signals, wherein the modifying the energy content comprises applying a psychoacoustic model that modifies the energy content based, at least in part, on characteristics of the transducer; and
outputting the modified audio signals to the transducer, wherein the step of receiving data comprises receiving time-domain audio data, and wherein the step of modifying the energy content of the audio signals comprises:

transforming the time-domain audio data into frequency-domain audio data;

transforming the frequency-domain audio data into sub-band domain audio data, wherein the sub-band domain audio comprises audio data organized into a plurality of sub-bands;

dynamically allocating compensation coefficients to the plurality of sub-bands;

reverse transforming the allocated compensation coefficients corresponding to the plurality of sub-bands back to the frequency domain;

multiplying the frequency-domain audio data by the dynamically-allocated compensation coefficients; and converting the multiplied frequency-domain audio data into processed time-domain audio data, wherein the processed time-domain audio data has a modified signal power compared to the received audio data, and wherein the modified audio signals output to the transducer are based, at least in part, on the processed time-domain audio data.

2. The method of claim 1, wherein the dynamically-allocated compensation coefficients are selected to reduce energy in the plurality of sub-bands that is not reproducible by an output transducer.

3. The method of claim 1, wherein the dynamically-allocated compensation coefficients are selected to reduce energy in the plurality of sub-bands that is inaudible to a listener of an output transducer.

4. The method of claim 1, wherein the step of transforming the frequency-domain audio data into sub-band domain audio data comprises transforming the frequency-domain audio data into sub-band domain audio data using a mathematical transform matrix T, and wherein the step of reverse transforming the allocated compensation coefficients corresponding to the plurality of sub-bands back to the frequency domain comprises reverse transforming the allocated compensation coefficients corresponding to the plurality of sub-bands back to the frequency domain using a reverse transform matrix Tr.

5. The method of claim 1, wherein the step of dynamically allocating compensation coefficients comprises:

comparing power levels for the plurality of sub-bands to corresponding N number of hearing thresholds;

comparing power levels for the plurality of sub-bands to corresponding feedback current and voltage signals from the transducer; and allocating the compensation coefficients based on the steps of comparing the power levels to the hearing thresholds and the feedback current and voltage signals.

6. The method of claim 5, further comprising calculating a hearing threshold for each of the plurality of sub-bands based, at least in part, on psychoacoustic principles before the step of comparing the power levels for the plurality of sub-bands to corresponding hearing thresholds.

7. The method of claim 5, wherein the step of allocating the compensation coefficients comprises, when a sub-band is below or above a corresponding hearing threshold, allocating a compensation coefficient to the sub-band to modify energy in the sub-band.

8. The method of claim 5, wherein the step of allocating the compensation coefficients comprises:

when a sub-band component is below a corresponding hearing threshold by a first difference, allocate a coefficient to modify the sub-band by a first amount;

when a sub-band component is below a corresponding hearing threshold by less than the first difference, allocate a coefficient to modify the sub-band by a second amount that is less than the first amount;

when a sub-band component is approximately equal to a corresponding hearing threshold, allocate a coefficient to modify the sub-band; and when a sub-band component is above a corresponding hearing threshold and one or more neighboring sub-bands are approximately equal to or below a corresponding hearing threshold, allocate a coefficient to modify sub-band by a third amount that is less than the first amount.

9. The method of claim 1, wherein the compensation coefficients are allocated values such that the audio data is modified to be more power efficient and sound enhanced.

10. The method of claim 1, wherein the step of converting into frequency-domain audio data comprises performing a Fast Fourier Transform (FFT) on the audio data.

11. The method of claim 1, wherein the step of converting the frequency-domain audio data comprises transforming the frequency-domain audio data into sub-band domain audio data using any arbitrary mathematical transform matrix T.

12. The method of claim 1, wherein the step of outputting the modified audio signals protects the transducer from at least one of over current, over voltage, over excursion, or over temperature conditions by reducing the output power to the transducer without affecting at least one of a human-perceived loudness and human-perceived sound quality of the transducer.

13. The method of claim 12, wherein the step of outputting the processed audio data enhances sound effects in loudness and clarity and reduces distortion from the transducer.

14. An apparatus, comprising: a transducer; and a controller coupled to the transducer and configured to perform steps comprising:

receiving data corresponding to audio signals;

modifying an energy content of the audio signals to form modified audio signals, wherein the modifying the energy content comprises applying a psychoacoustic model that modifies the energy content based, at least in part, on characteristics of the transducer; and outputting the modified audio signals to the transducer, wherein the controller is configured to receive data by receiving time-domain audio data, and wherein the controller is configured to modify the energy content by performing steps comprising:

transforming the time-domain audio data into frequency-domain audio data;

transforming the frequency-domain audio data into sub-band domain audio data, wherein the sub-band domain audio comprises audio data organized into a plurality of sub-bands;

dynamically allocating compensation coefficients to the plurality of sub-bands;

reverse transforming the compensation coefficients corresponding to the plurality of sub-bands back to the frequency domain;

multiplying the frequency-domain audio data by the allocated compensation coefficients; and converting the multiplied frequency-domain audio data into processed time-domain audio data, wherein the processed audio data has modified signal power compared to the receiving digital or analog audio data, and wherein the modified audio signals output to the transducer are based, at least in part, on the processed time-domain audio data.

15. The apparatus of claim 14, wherein the dynamically-allocated compensation coefficients are selected to reduce energy in the plurality of sub-bands that is not reproducible by the transducer.

16. The apparatus of claim 14, wherein the dynamically-allocated compensation coefficients are selected to reduce energy in the plurality of sub-bands that is inaudible to a listener of the transducer.

17. The apparatus of claim 14, wherein the controller is configured to dynamically allocate compensation coefficients by performing steps comprising:
   comparing power levels for the plurality of sub-bands to corresponding hearing thresholds; and
   comparing power levels for the plurality of sub-bands to corresponding feedback current and voltage signals from the transducer; and
   allocating the compensation coefficients based on the steps of comparing the power levels with the hearing thresholds and the feedback current and voltage signals.

18. The apparatus of claim 17, wherein the controller is further configured to calculate a hearing threshold for each of the plurality of sub-bands based, at least in part, on psychoacoustic principles before the step of comparing the power levels for the plurality of sub-bands to corresponding hearing thresholds.

19. The apparatus of claim 17, wherein the controller is configured to allocate the compensation coefficients by, when a sub-band is below or above a corresponding hearing threshold, allocating a compensation coefficient to the sub-band to modify energy in the sub-band.

20. The apparatus of claim 17, wherein the controller is configured to allocate compensation coefficients by performing steps comprising:
   when a sub-band component is below a corresponding hearing threshold by a first difference, allocate a coefficient to modify the sub-band by a first amount;
   when a sub-band component is below a corresponding hearing threshold by less than the first difference, allocate a coefficient to modify the sub-band by a second amount that is less than the first amount;
   when a sub-band component is approximately equal to a corresponding hearing threshold, allocate a coefficient to modify the sub-band; and
   when a sub-band component is above a corresponding hearing threshold and one or more neighboring sub-bands are approximately equal to or below a corresponding hearing threshold, allocate a coefficient to modify sub-band by a third amount that is less than the first amount.

21. The apparatus of claim 14, wherein the controller is configured to allocate values as compensation coefficients such that the audio data is modified to be more power efficient.

22. The apparatus of claim 14, wherein the controller is configured to allocate values as compensation coefficients such that the audio data is modified to be more enhanced in loudness and clarity and less in distortion from the transducer.

23. The apparatus of claim 14, wherein the controller is configured to convert audio data into frequency-domain audio data by performing a Fast Fourier Transform (FFT) on the audio data.

24. The apparatus of claim 14, wherein the controller is configured to convert the frequency-domain data by transforming the frequency-domain audio data into sub-band domain audio data using an arbitrary mathematical transform matrix T.

25. The apparatus of claim 14, wherein the controller is further configured to transmit the processed time-domain audio data over a communications link.

26. The apparatus of claim 14, wherein the step of outputting the modified audio signals protects the transducer from at least one of over current, over voltage, over excursion, or over temperature conditions by reducing the output power to the transducer without affecting at least one of a human-perceived loudness and human-perceived sound quality of the transducer.

27. A mobile device, comprising:
   a microspeaker;
   an amplifier coupled to the microspeaker, wherein the amplifier is configured to receive an input audio signal and amplify the input audio signal for reproduction on the microspeaker; and
   a controller coupled to the amplifier, wherein the controller is configured to perform steps comprising:
      receiving data corresponding to audio signals;
      modifying an energy content of the audio signals to form modified audio signals, wherein the modifying the energy content comprises applying a psychoacoustic model that modifies the energy content based, at least in part, on characteristics of the transducer; and
      outputting the modified audio signals to the transducer as the input audio signal to the amplifier,
   wherein the controller is configured to receive data by receiving time-domain audio data, and wherein the controller is configured to modify the energy content by performing steps comprising:
      converting the time-domain audio data into frequency-domain audio data;
      converting the frequency-domain audio data into sub-band domain audio data, wherein the sub-band domain audio comprises audio data organized into a plurality of sub-bands;
      dynamically allocating compensation coefficients to the plurality of sub-bands;
      multiplying the frequency-domain audio data by the dynamically allocated compensation coefficients; and
      converting the multiplied frequency-domain audio data into processed audio data, wherein the processed audio data has reduced signal power compared to the receiving audio data, and wherein the reduced signal power protects the speaker from at least one of over current, over voltage, over excursion, or over temperature conditions without affecting at least one of a human-perceived loudness and human-perceived sound quality of the speaker,
   wherein the modified audio signals output to the amplifier are based, at least in part, on the processed audio data.

28. The apparatus of claim 27, wherein the dynamically-allocated compensation coefficients are selected to reduce energy in the plurality of sub-bands that is not reproducible by the microspeaker.

29. The apparatus of claim 27, wherein the dynamically-allocated compensation coefficients are selected to reduce energy in the plurality of sub-bands that is inaudible to a listener of the microspekaer.

30. The apparatus of claim 27, wherein the controller is configured to dynamically allocate compensation coefficients by performing steps comprising:
comparing power levels for the plurality of sub-bands to corresponding hearing thresholds;
comparing power levels for the plurality of sub-bands to corresponding feedback current and voltage signals from a transducer; and
allocating the compensation coefficients based on the steps of comparing the power levels with the hearing thresholds and the feedback current and voltage signals.

31. The apparatus of claim 30, wherein the controller is further configured to calculate a hearing threshold for each of the plurality of sub-bands based, at least in part, on psychoacoustic principles before the step of comparing the power levels for the plurality of sub-bands to corresponding hearing thresholds.

32. The apparatus of claim 30, wherein the controller is configured to allocate the compensation coefficients by, when a sub-band is below or above a corresponding hearing threshold, allocating a compensation coefficient to the sub-band to modify energy in the sub-band.

33. The apparatus of claim 30, wherein the controller is configured to allocate compensation coefficients by performing steps comprising:
when a sub-band component is below a corresponding hearing threshold by a first difference, allocate a coefficient to modify the sub-band by a first amount;
when a sub-band component is below a corresponding hearing threshold by less than the first difference, allocate a coefficient to modify the sub-band by a second amount that is less than the first amount;
when a sub-band component is approximately equal to a corresponding hearing threshold, allocate a coefficient to modify the sub-band; and
when a sub-band component is above a corresponding hearing threshold and one or more neighboring sub-bands are approximately equal to or below a corresponding hearing threshold, allocate a coefficient to modify sub-band by a third amount that is less than the first amount.

34. The apparatus of claim 27, wherein the controller is configured to convert audio data into frequency-domain audio data by performing a Fast Fourier Transform (FFT) on the time-domain audio data.

35. The apparatus of claim 27, wherein the controller is configured to convert the frequency-domain audio data sub-band domain audio data using an arbitrary mathematical transform matrix T.

36. The apparatus of claim 27, wherein the controller is configured to modify the energy content for speaker protection of the micro speaker.

* * * * *